United States Patent [19]

Hartmann et al.

[11] Patent Number: 4,599,587
[45] Date of Patent: Jul. 8, 1986

[54] IMPEDANCE ELEMENT

[75] Inventors: Clinton S. Hartmann, Richardson; Peter Wright, Dallas, both of Tex.

[73] Assignee: R. F. Monolithics, Inc., Dallas, Tex.

[21] Appl. No.: 677,518

[22] Filed: Dec. 3, 1984

[51] Int. Cl.$^4$ .............. H03H 7/01; H03H 7/09; H03H 9/25; H03H 9/64
[52] U.S. Cl. .................. 333/176; 310/313 R; 333/177; 333/193; 333/196
[58] Field of Search .............. 333/150-155, 333/193-196, 167-172, ¼-180; 310/313 R, 313 A, 313 B, 313 C, 313 D; 331/107 A; 29/25.35

[56] References Cited

U.S. PATENT DOCUMENTS

| | | | |
|---|---|---|---|
| 3,241,092 | 3/1966 | Toyoshima | 333/189 |
| 4,126,837 | 11/1978 | Koyamada et al. | 333/196 X |
| 4,166,258 | 8/1979 | Tseng | 333/195 |
| 4,353,046 | 10/1982 | Hartmann | 333/194 |

*Primary Examiner*—Marvin L. Nussbaum
*Attorney, Agent, or Firm*—Sigalos & Levine

[57] ABSTRACT

An impedance element formed from a single-port, surface acoustic wave transucer which generates a conductance versus frequency response characteristic having first and second peaks separated by a valley at a predetermined frequency and which generates a susceptance versus frequency response characteristic having a substantially constant portion over a finite bandwidth on both sides of said predetermined frequency.

22 Claims, 43 Drawing Figures

FORWARD TRANSMISSION COEFFICIENT

FORWARD TRANSMISSION COEFFICIENT

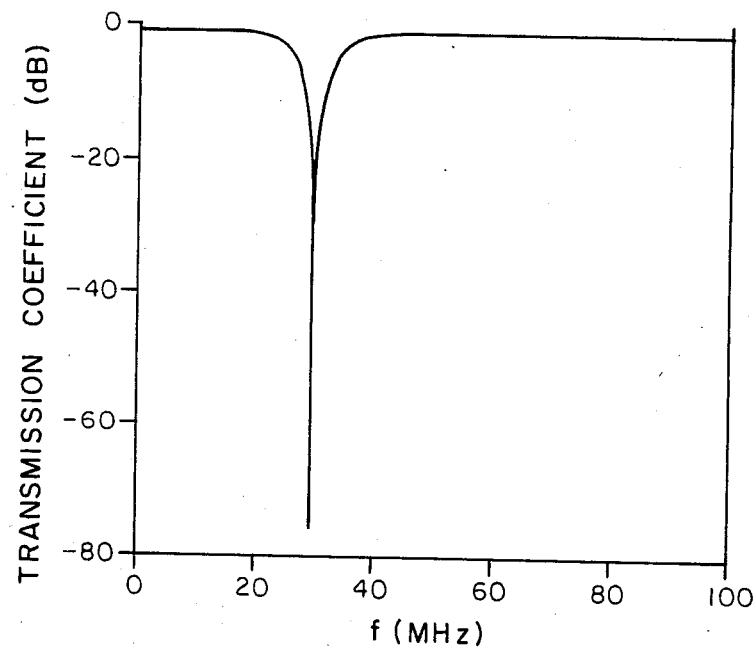
FORWARD TRANSMISSION COEFFICIENT
FIG. 7 _PRIOR ART_
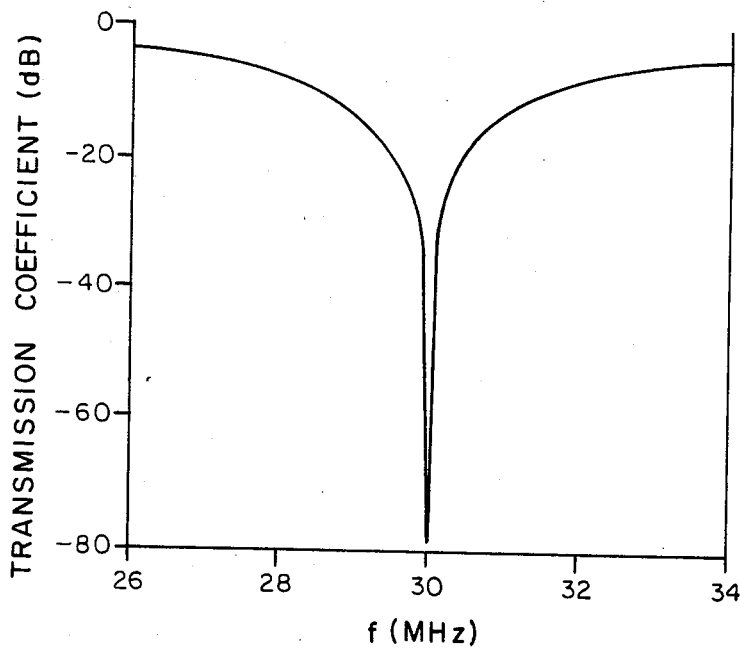
FORWARD TRANSMISSION COEFFICIENT
FIG. 8 _PRIOR ART_

INPUT ADMITTANCE

INPUT ADMITTANCE f
INPUT ADMITTANCE f
INPUT ADMITTANCE

INPUT ADMITTANCE

FORWARD TRANSMISSION COEFFICIENT

FORWARD TRANSMISSION COEFFICIENT

FORWARD TRANSMISSION COEFFICIENT

IMPEDANCE ELEMENT

BACKGROUND OF THE INVENTION

The present invention relates in general to an improved impedance element comprising a Surface Acoustic Wave Single Phase Unidirectional Transducer (SPUDT) which generates a conductance versus frequency response having first and second peaks separated by a valley, the center of the valley occurring at a predetermined frequency and generating a susceptance versus frequency response having a substantially flat portion over a finite bandwidth on either side of the predetermined frequency. It has particular utility with a notch filter.

A notch filter is a device which is generally presumed to pass all frequencies except for a very narrow band which is "notched out". This type of filter is sometimes called a band elimination filter as well. In practice, the notch filter may have only a limited band for passing signals but typically this band width is several octaves wide.

Notch filter circuits are widely used in television receivers in the IF section to eliminate discrete frequency regions where unwanted carriers appear from adjacent channels. Notch filters are also used widely in cable television systems to deny access to certain signals or alternatively to remove interference in other signals.

Important characteristics of a notch filter are:
1. The amount of insertion loss in its pass region.
2. The flatness of the amplitude response in the band pass region.
3. The depth of the rejection notch.
4. The width of the rejection notch at its ultimate rejection level.
5. The width of the rejection notch measured 3 dB down from the band pass region of the notch.

Typically it is desired to have the lowest possible loss and no ripple in the pass region, as much depth at the ultimate point in the notch as possible, good width at the bottom of the notch and very narrow width at the 3 dB points on the notch.

Notch filters are generally implemented with inductors and capacitors (L's and C's) and can take one of many forms. Commonly used circuits include a shunt notch, a series notch and a bridged-T notch. A shunt notch is one in which a series resonant circuit is in parallel with the desired transmission path. This approach shunts the undesired band to ground. A series notch is one in which a parallel-tuned circuit is placed in series with the transmission line and the high impedance of the parallel-tuned circuit in resonance effectively blocks the frequency of interest from the output. For both of these circuits, the notch depth is directly related to the parasitic loss (or Q) of the inductors and capacitors used to implement the notch. The bridged-T notch circuits are an improvement on the simple series and shunt notches. Theoretically, infinite attenuation is achievable at a single frequency with a bridged-T notch if all components are chosen properly. This is achieved in spite of the finite Q in the inductors and capacitors which are used.

With higher frequencies, particularly into the ultra-high frequency range, narrower and narrower notches are generally desired when measured as a fraction of a center frequency because of the need to eliminate carriers or undesired signals which are much closer to the desired signals when measured as a fraction of the center frequency. However, inductors and capacitors are prone to temperature drift and have poor Q at UHF frequencies and the net result is that notch filters implemented using LC components tend to drift off of the desired frequency and in many cases the notch width is too broad or the filter loss is too high or both. For frequencies above approximately 150 megahertz, notch circuits are generally not utilized because of these problems.

SAW devices inherently have much higher Q's than LC filter elements and further they generally exhibit much superior temperature stability as compared to LC elements. For both of these reasons it is desirable to implement notch filters using SAW devices particularly in the UHF band.

The difficulty in implementing a notch filter with SAW devices stems from the fact that SAW devices are of themselves band pass elements in their normal configuration in which one transducer launches a wave and a second transducer receives the wave. Thus to produce a notch characteristic the devices must be used in conjunction with some other circuit which converts the band pass region of the SAW to a band reject region and vice versa.

In general the transmission characteristics of a SAW device exist only over a narrow band of frequencies which is determined by the number of electrodes and their particular placement on the transducers' surface.

In using a SAW device for a notch application, the SAW device has typically been used as one leg in some bridge circuit in which balancing of the bridge occurs at the center of the frequency of the SAW device and hence no transmission through the bridge circuit occurs.

The SAW device can either be used as a transmission element; i.e., two-port element in a bridge, or as a one-port impedance element in a bridge. When used as a transmission element in a bridge, the notch filter typically has high transmission loss because the normal loss of the SAW device is very large. The exception to this case occurs when a low loss SAW device (such as a two-port resonator or low-loss transversal SAW filter) is used.

The other method uses the SAW device as an impedance element as disclosed by D. P. Akiit in "70 MHz Surface-Acoustic-Wave Resonator Notch Filter", *Electronics Letters*, Apr. 29, 1976, Volume 12, No. 9, pages 217 and 218. He describes a notch filter where a SAW device is used as an impedance element. Also Y. Koyamada et al. in "Band Elimination Filter Employing Surface Acoustic Wave Resonator" *Electronics Letters*, 1975, Volume 11, pages 108–109, discusses the use of SAW impedance elements to facilitate notch filters in the UHF range.

Two problems generally exist with the prior art notch filters. The first is that the insertion loss of the filter is typically fairly high and the second is that the bandwidth of the notch is typically very narrow because the transmission phase characteristics of the surface acoustic wave are changing rapidly with frequency and hence the bridge is only in balance over a very narrow region where the transmission phase of the surface acoustic wave is exactly correct.

The first problem, insertion loss, has been previously overcome by using a low loss surface acoustic wave device such as a surface acoustic wave resonator. Unfortunately, use of a surface acoustic wave resonator makes the second problem, bandwidth, somewhat worse because the phase slope in the transmission response is very steep in a surface acoustic wave resonator structure. In principle, one could use a low-loss surface acoustic wave filter and thereby have a somewhat less steep phase slope but any two-port surface acoustic wave device will always have a finite phase slope simply because the phase slope represents the time delay between the input and output transducer. The input and the output transducers must always be physically separated from one another on the surface acoustic wave device surface. Thus, it is impossible to achieve a two-port surface acoustic wave device in which both the transmission magnitude and the transmission phase are constant over a reasonable bandwidth.

In many cases, it is desired to have a notch filter where the bottom of the notch has a finite width to allow for temperature drift or other instability in either the notch filter or the signal to be rejected by the notch. The present invention is a SAW device whose input admittance is relatively constant in both magnitude and phase across the bandwidth of the notch thus resulting in a notch filter with broader rejection characteristics than are typically achieved in the prior art. When this type of device is used in a bridge configuration the "balance condition" which results in the notch is then achieved over a broader bandwidth.

DISCLOSURE OF THE INVENTION

The present invention overcomes the disadvantages of the prior art impedance devices by utilizing a novel impedance element formed from a surface acoustic wave device. The novel impedance element has a conductance versus frequency response with first and second peaks separated by a valley at a particular frequency and a susceptance versus frequency response having a substantially flat portion over a finite bandwidth on each side of said particular frequency and can be used in a shunt notch circuit, series notch circuit, various bridged-T type notch circuits and transformer-bridge notch circuits.

SUMMARY OF THE INVENTION

Thus, the present invention relates to an improved impedance element comprising a single-port, single-phase, unidirectional transducer for generating a conductance versus frequency response having first and second peaks separated by a valley at a predetermined frequency and a susceptance versus frequency response having a substantially flat portion over a finite bandwidth on both sides of said predetermined frequency.

The invention further relates to a method of forming an impedance element comprising the steps of selecting a desired conductance versus frequency response function having first and second peaks separated by a valley, said valley occurring at a predetermined frequency, calculating the square root of said function, taking the inverse Fourier transform of said square root to obtain an impulse response, and implementing the resulting impulse response with a single-port surface acoustic wave transducer to generate a susceptance versus frequency response having a substantially flat portion over a finite bandwidth on both sides of said desired frequency.

BRIEF DESCRIPTION OF THE DRAWINGS

These and other objects and advantages of the present invention will be disclosed in conjunction with the accompanying drawings in which:

FIG. 7 is a graph illustrating the transmission characteristic of a bridged-T notch circuit of the type shown in FIGS. 3 and 4 where the inductor has a Q of 50;

FIG. 8 illustrates the frequency response of the same bridged-T notch circuit as in FIG. 7 except plotted over a narrower frequency range;

DETAILED DESCRIPTION OF THE DRAWINGS

Figure 1:
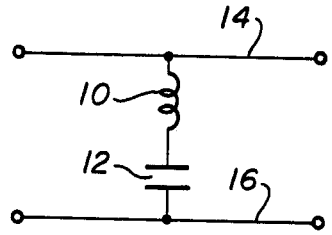
FIG. 1 is a schematic representation of a shunt notch filter of the prior art.

FIGS. 1 through 4 are schematic representation of commonly used circuits utilizing inductors and capacitors to implement notch filters. FIG. 1 is a shunt notch in which a series resonant circuit comprising coil 10 and capacitor 12 is in parallel with the desired transmission path. This approach shunts the undesired band on transmission path 14 to ground 16.

Figure 2:
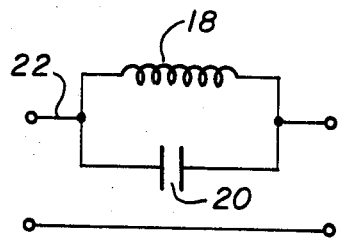
FIG. 2 is a schematic representation of a series notch filter of the prior art.
Figure 3A:
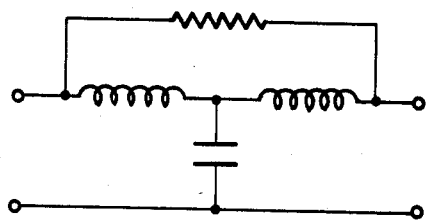
FIGS. 3a and 3b are schematic representations of bridged-T notch filters of the prior art.
Figure 3B:
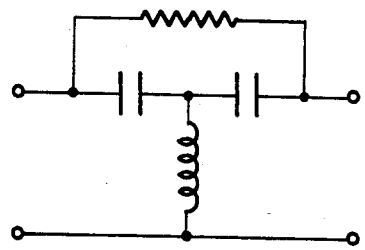
Figure 4A:
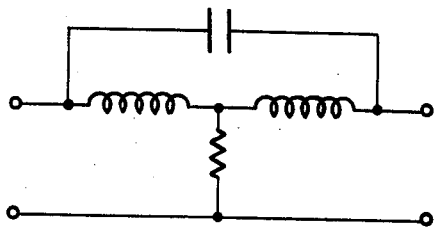
FIGS. 4a and 4b are schematic representations of alternative bridged-T notch filters of the prior art.
Figure 4B:
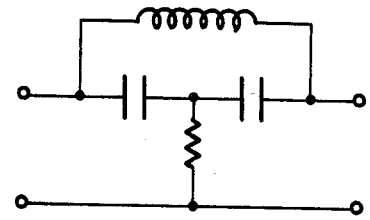

FIG. 2 shows a series notch in which a parallel-tuned circuit comprising coil or inductor 18 and capacitor 20 is placed in series with the transmission line 22 and the high impedance of the parallel-tuned circuit at resonance effectively blocks the frequency of interest from the output. From both of the circuits in FIG. 1 and FIG. 2, the noth depth is directly related to the parasitic loss (or Q) of the inductors 10 and 18 and capacitors 12 and 20 used to implement the notch.

The bridged-T notch circuits shown in variations in FIG. 3(a) and FIG. 3(b) and FIG. 4(a) and FIG. 4(b) are an improvement on the simple series and shunt notches shown in FIGS. 1 and 2. Theoretically infinite attenuation is achievable at a single frequency with a bridged-T notch if all components are chosen properly. This attenuation is achieved in spite of the finite Q in the inductors and capacitors which are used.

Figure 5:
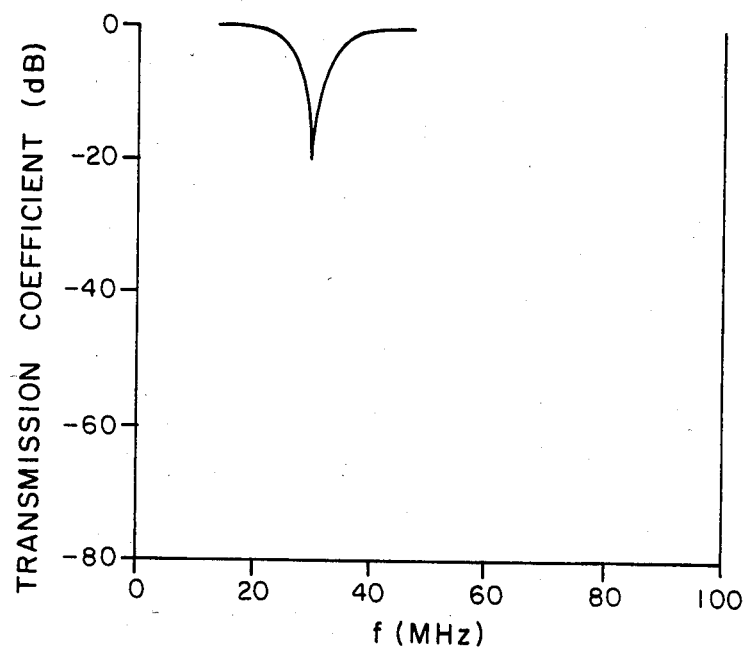
FIG. 5 is a graph illustrating the transmission characteristics of a notch circuit of the type illustrated in FIG. 2.
Figure 6:
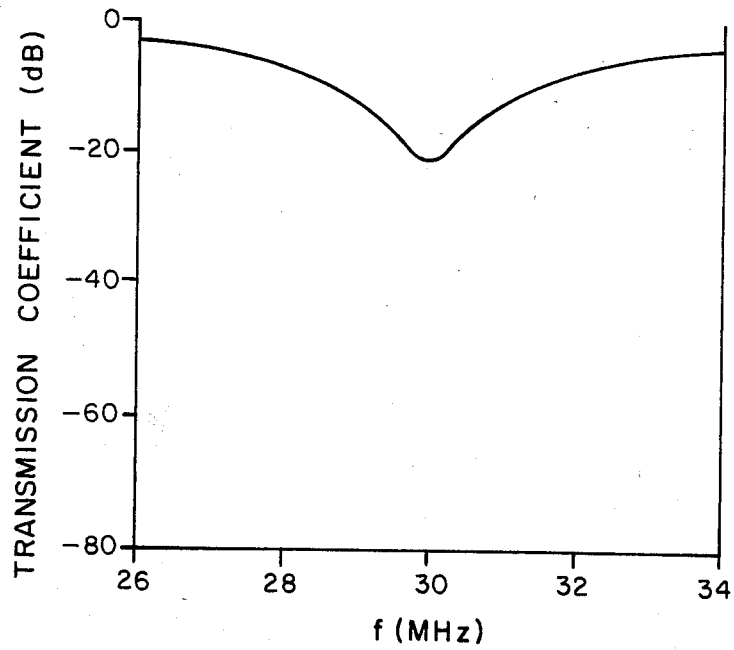
FIG. 6 is a graph of the transmission characteristic of the same notch in FIG. 2 except plotted over a narrower frequency range.

FIG. 5 shows the characteristics of a notch circuit of the type shown in FIG. 2 at 30 MHz where the inductance used is assumed to have a Q of 50. The notch depth is approximately 20 dB. FIG. 6 shows the characteristic of the same notch over a narrower frequency range.

In FIG. 7 the frequency response of a bridged-T notch using the same inductors and inductor Q's is shown. The circuit configuration in this case is of the type shown in FIG. 4(a) or 4(b). It will be noted that the notch depth is now almost 80 dB but the out-of-band loss is now increased by one dB. FIG. 8 shows the frequency response of this bridged-T notch over a narrower frequency range.

With higher frequencies, particularly into the ultra high frequency range, narrower and narrower notches are generally desired when measured as a fraction of a center frequency because of the need to eliminate carriers or undesired signals when measured as a fraction of the center frequency. However, inductors and capacitors are prone to temperature drift and have poor Q and UHF frequencies and the net result is that notch filters implemented using LC components tend to drift off of the desired frequency and in many cases the notch width is too broad or the filter loss is too high or both. For frequencies above approximately 150 MHz, notch circuits are generally not utilized because of these problems.

SAW devices inherently have much higher Q's than LC filter elements and further they generally exhibit much superior temperature stability as compared to LC elements. For both of these reasons it is desirable to implement notch filters using SAW devices particularly in the UHF band.

Figure 9:
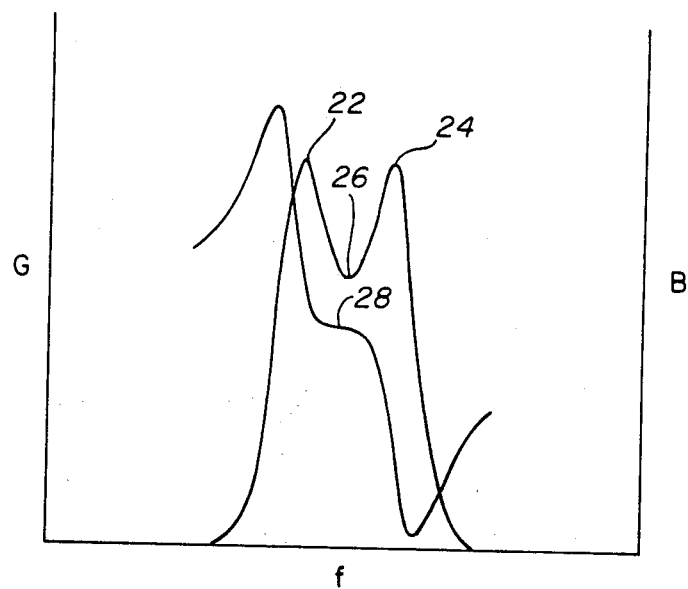
FIG. 9 illustrates the ideal conductance or real part of the admittance of an impedance element of the present invention and the corresponding ideal susceptance or imaginary part of such impedance element.

To achieve a broader bandwidth notch, a SAW element has been developed whose input admittance is reasonably constant in both magnitude and phase over a reasonable bandwidth. As discussed by C. S. Hartmann, et al. in "Impulse Model Design of Acoustic Surface Wave Filters", *IEEE Transactions on Microwave Theory and Techniques*, Vol. MTT-21, pp. 162-175, April 1973, the real and imaginary part of any SAW transducer admittance are related by the Hilbert Transform relationship. The Hilbert transform of a function approximates taking the derivative of that function. Thus, if a SAW device could achieve an input admittance of the form shown in FIG. 9 in which the conductance, or real part, consisted of two peaks 22 and 24 separated by an intervening valley 26, then the Hilbert transform of this conductance function may have a flat region 28 in the susceptance function across the same frequency range where the center valley occurs if the proper reflection coefficient magnitude is chosen. In this central region of the input admittance, both the conductance, which has a local minimum 26, and the susceptance (where the proper reflection coefficient magnitude is chosen), are reasonably constant as shown and hence the overall input admittance of the device is reasonably constant over a finite bandwidth. Any desired slope 28 of the susceptance plot at center frequency can be obtained by varying the magnitude of the reflection coefficient per wave length in the device. Another method of realizing an input admittance curve of this type with SAW devices is to utilize the concept discussed in the Hartmann et al. paper disclosed earlier. In that paper it is pointed out that the input conductance of a SAW device is equal to the magnitude squared of the Fourier transform of the impulse response of the SAW transducer. Therefore, the desired admittance can be obtained by considering the desired conductance function as shown in FIG. 9, taking its square root, inverse Fourier transforming it and then implementing the resulting impulse response using well-known design techniques would give the susceptance characteristics shown in FIG. 9. The impulse response can be implemented by forming a surface acoustic wave device having no internal reflections and weighting electrodes on the device to obtain the desired impulse response.

Figure 10:
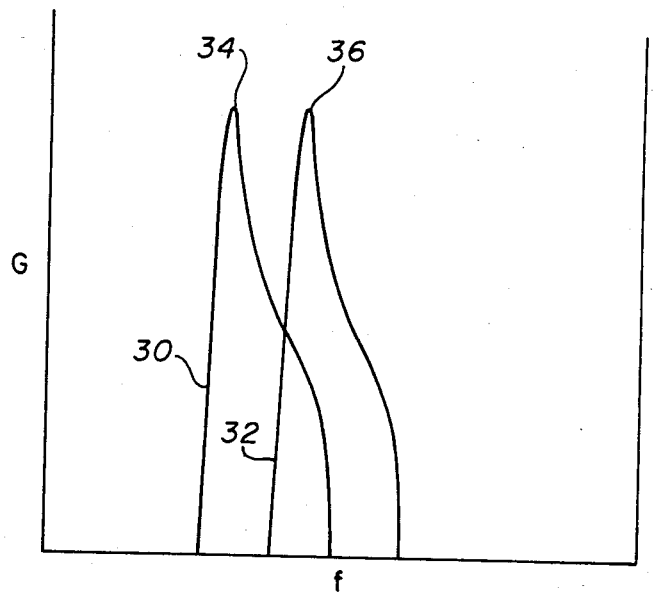
FIG. 10 is a graph illustrating the conductance wave forms of two conventional surface acoustic wave devices connected in parallel to achieve the desired conductance function.
Figure 14:
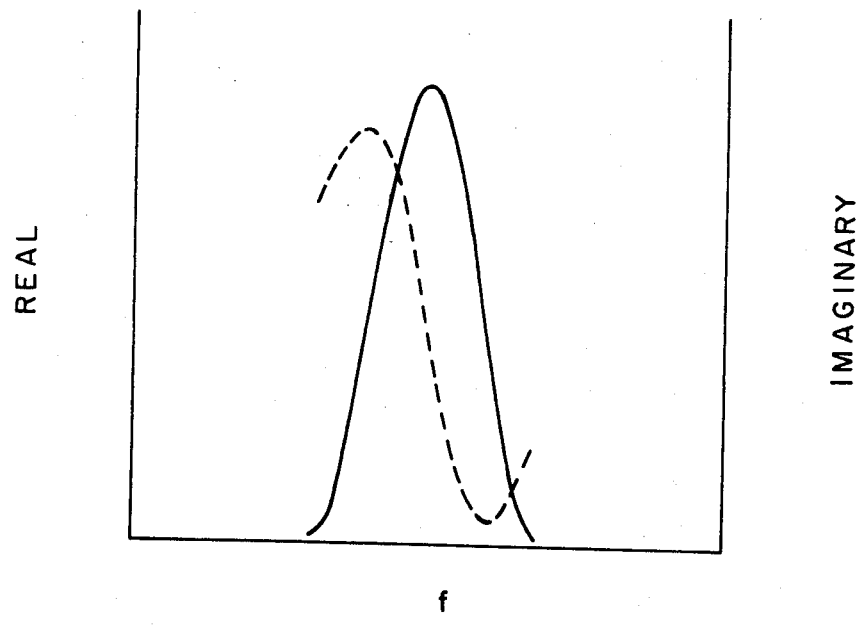
FIGS. 14–19 illustrate the theoretical input admittances of the device used to generate the graph in FIG. 11 where the internal reflection per wavelength is set respectively to 0%, 25%, 50%, 100%, 150%, and 200% of the amount required for achieving a relatively flat susceptance characteristic.
Figure 15:
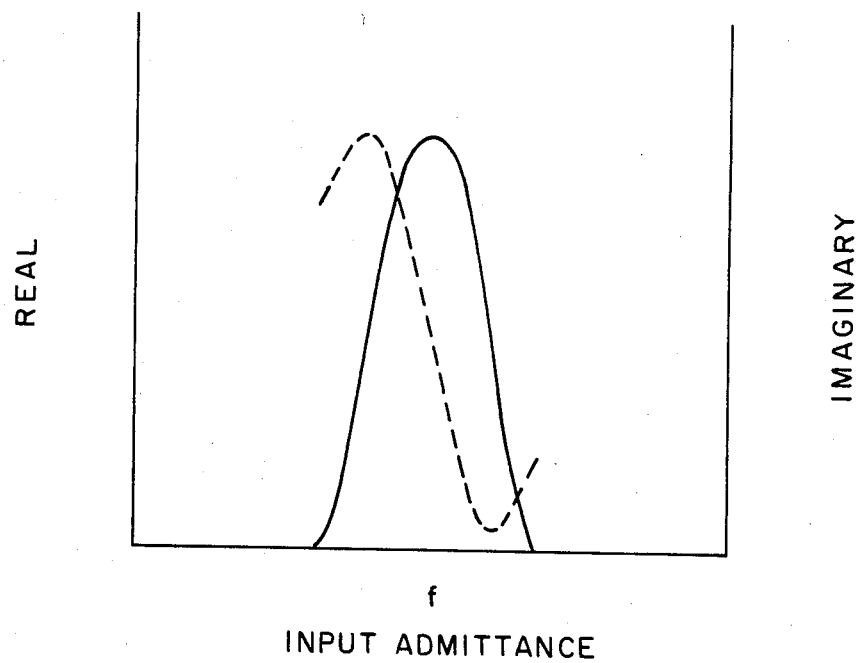
Figure 16:
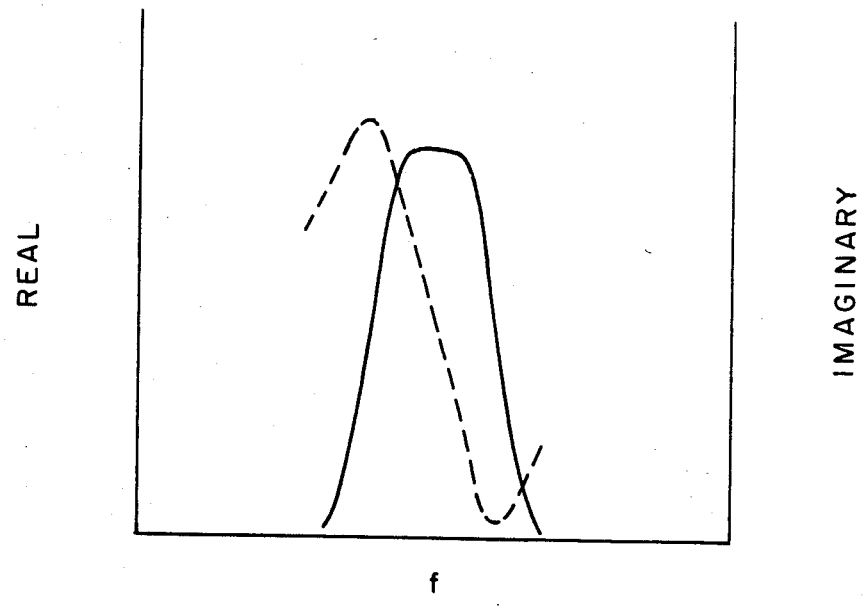
Figure 17:
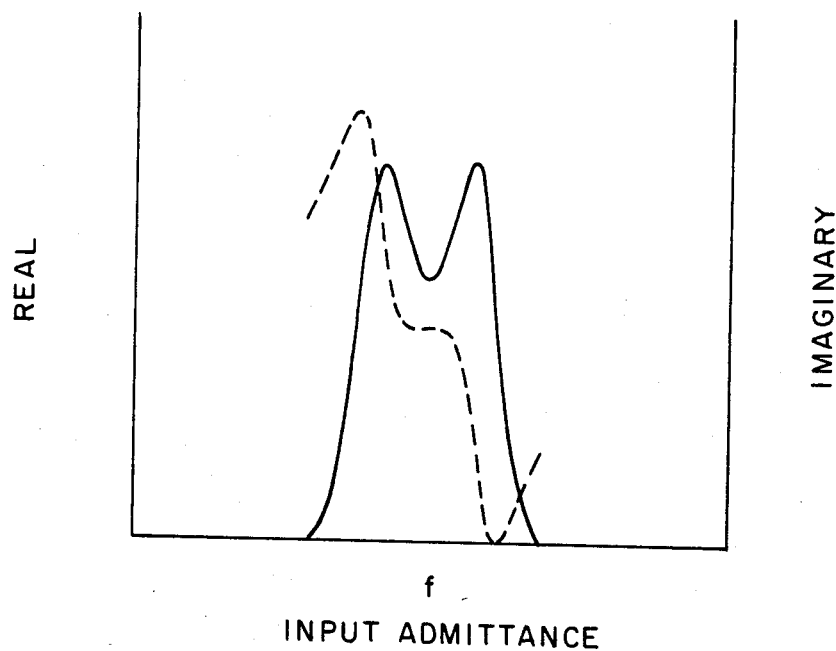
Figure 18:
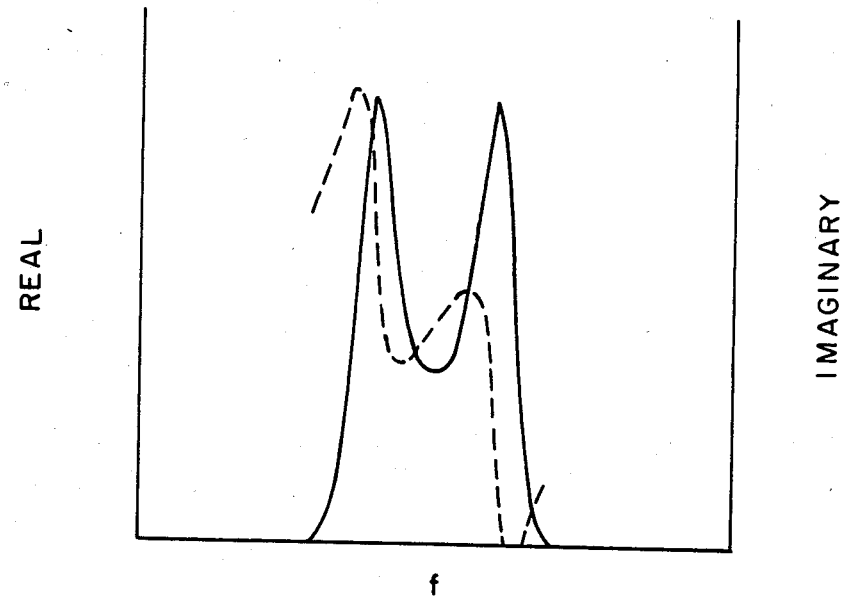
Figure 19:
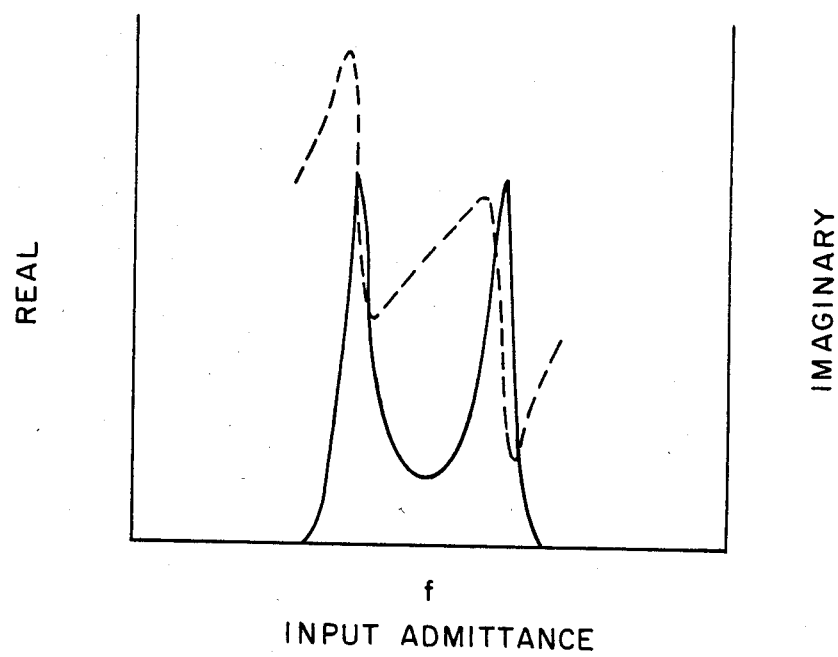
Figure 20:
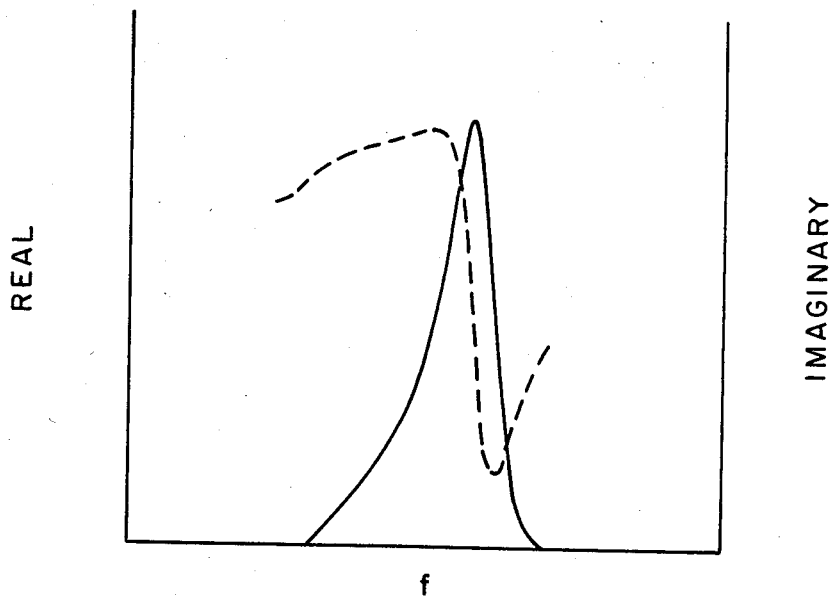
FIGS. 20–28 illustrate the theoretical input admittances of the same 600 wavelength transducer used to obtain FIG. 11 where the phase angle between the centers of reflection and transduction is respectively varied from 0°, 15°, 30°, 40°, 45°, 50°, 60°, 75°, and 90°.
Figure 21:
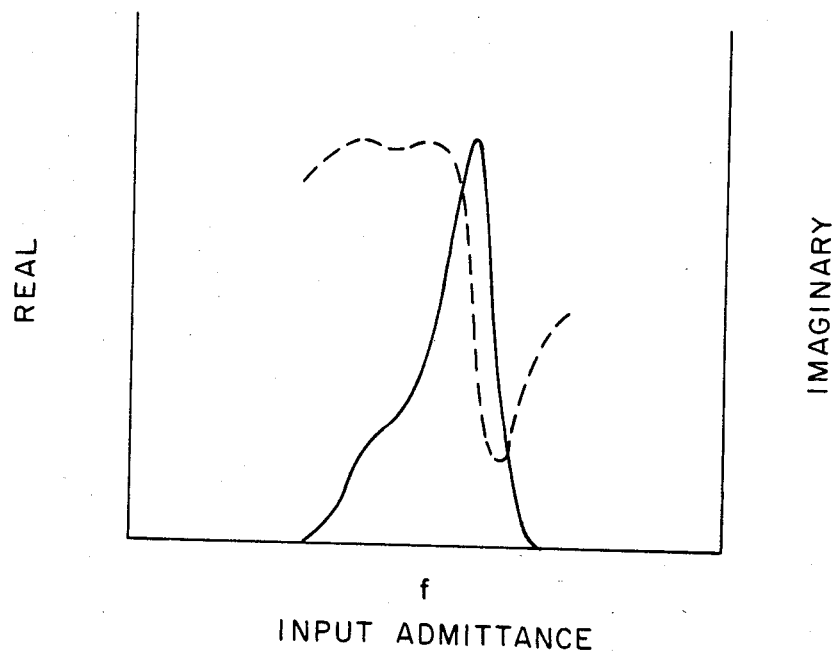
Figure 22:
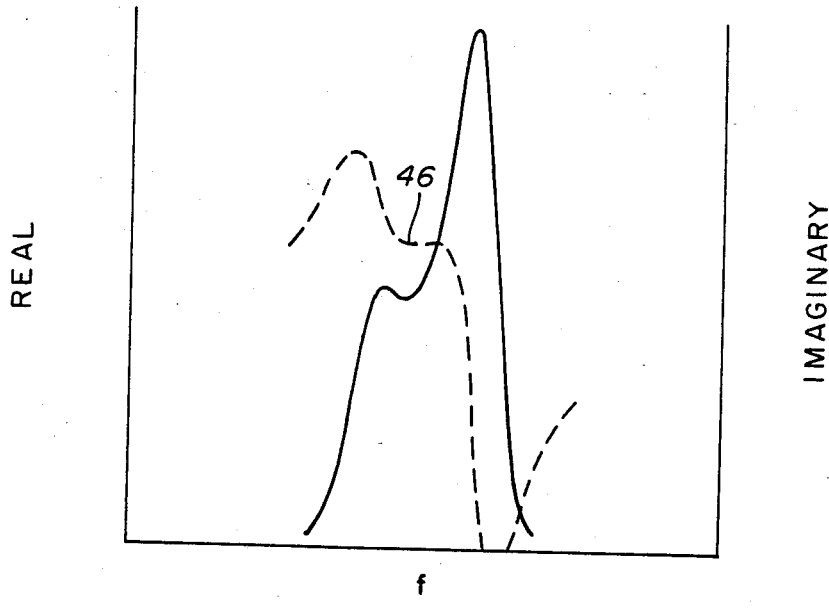
Figure 23:
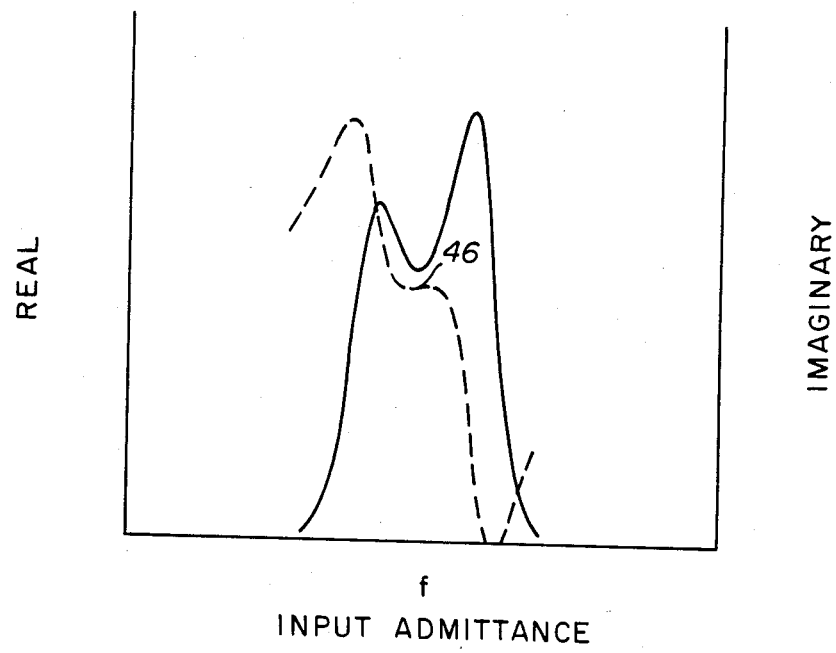
Figure 24:
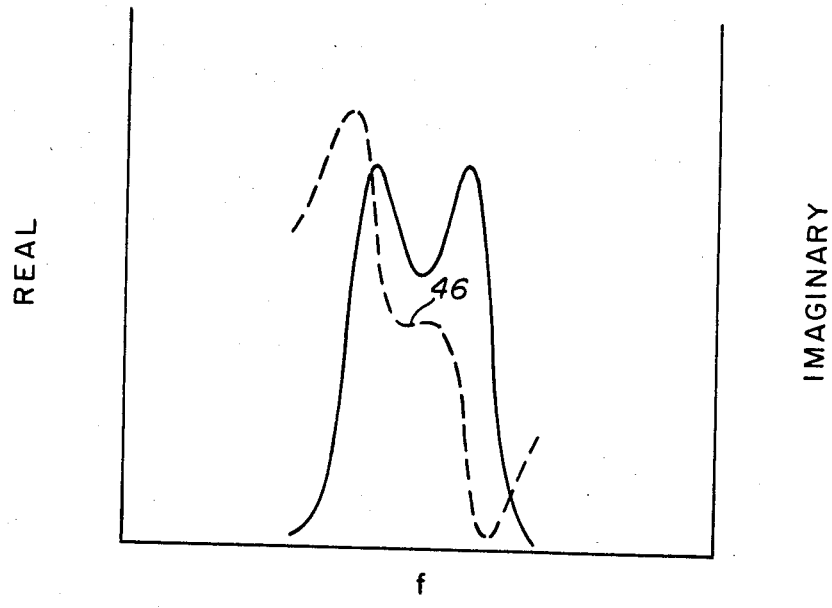
Figure 25:
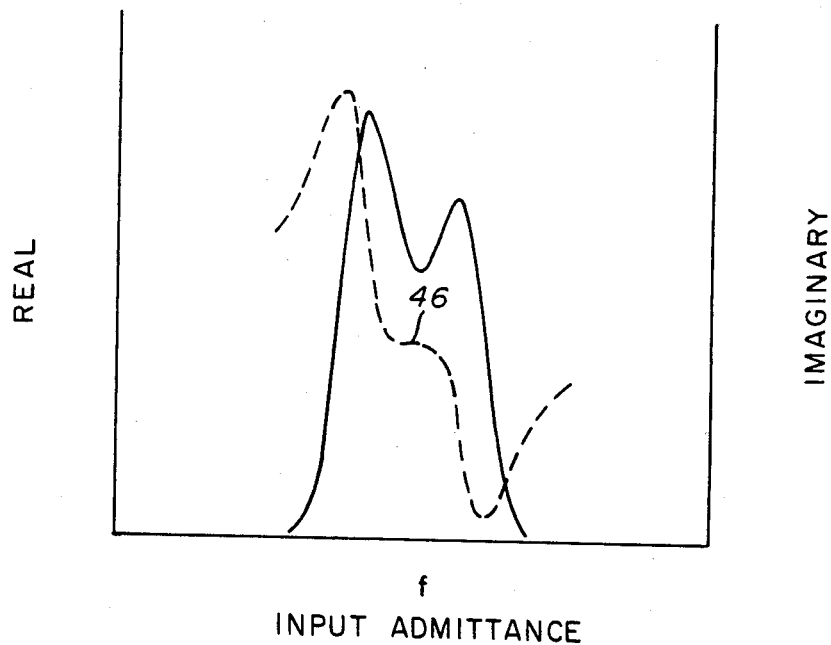
Figure 26:
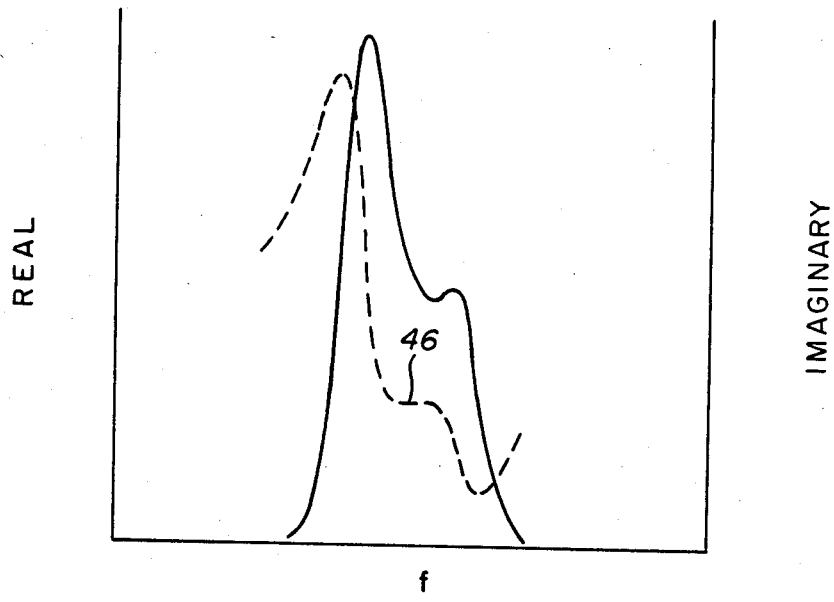
Figure 27:
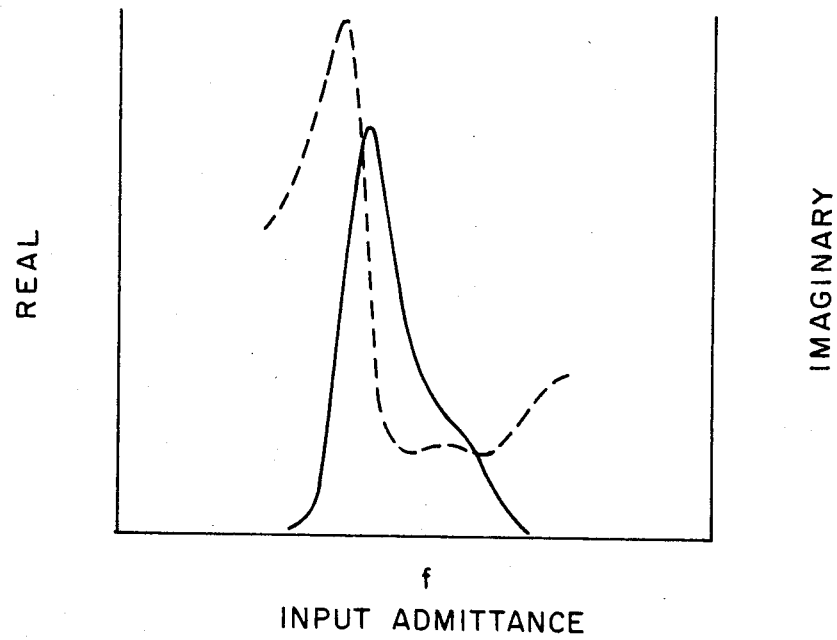
Figure 28:
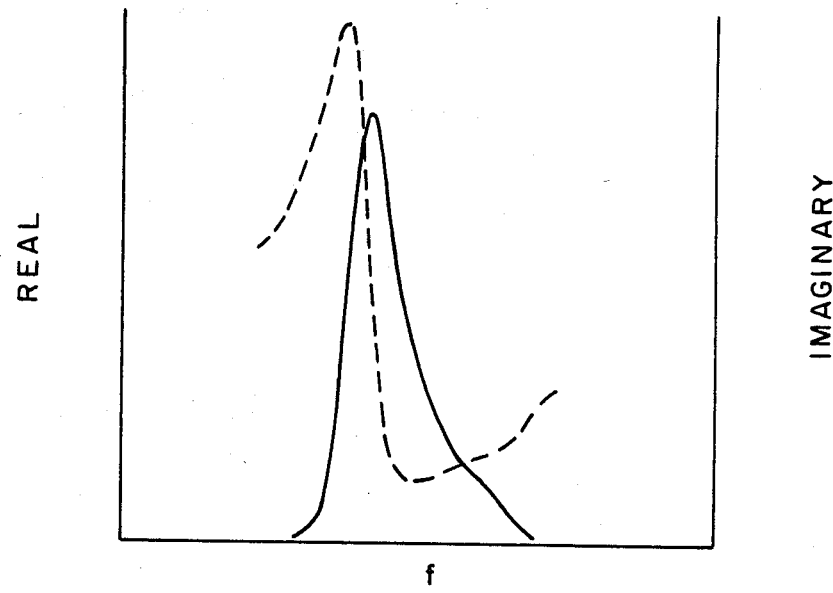

Since it is well known that the conductance versus frequency response of a SAW transducer typically has the shape shown by the curve 30 in FIG. 10, a third method of achieving the desired characteristic would be to parallel connect two SAW transducer elements, one of which has a radiation conductance peak at one of the two peaks 22 or 24 shown in FIG. 9 and the other has a radiation conductance peak at the second of the two peaks shown in FIG. 9. Thus, in FIG. 10 the first curve 30 can represent the conductance/frequency response of the first parallel SAW transducer element while the second curve 32 can represent the radiation conductance peak of the second parallel transducer. When the two are placed in parallel, the resulting conductance versus frequency curve as shown in FIG. 10 reasonably approximates that shown in FIG. 9. By judicious choice of the spacing of the two peaks 34 and 36, the bandwidth of the two units, and the desired reflectivity, an overall conductance characteristic as desired could be obtained as shown in FIG. 10 which would then of necessity lead to the desired corresponding susceptance function as shown in FIG. 9. The parallel connected elements could include normal SAW transducers, SAW resonators, or SAW transducers with internal reflections. It will be understood that, in addition to using parallel connected elements that have the conductance wave shapes shown in FIG. 10, other parallel elements could be used that produced spaced apart conductance wave shapes of the type shown in FIG. 14 or one element could be used that produces the conductance wave shape of FIG. 21 while the second element could be one that produces a conductance wave shape of the form shown in FIG. 20. In each case, the spaced apart peaks and separating valley can be utilized to generate the desired susceptance function shown in FIG. 9.

However, the preferred embodiment for achieving these characteristics in FIG. 9 is by means of single-phase, unidirectional transducer because this type of input admittance characteristic arises naturally in a substantially unweighted version of that structure when the proper amount of internal reflectivity is chosen.

Figure 11:
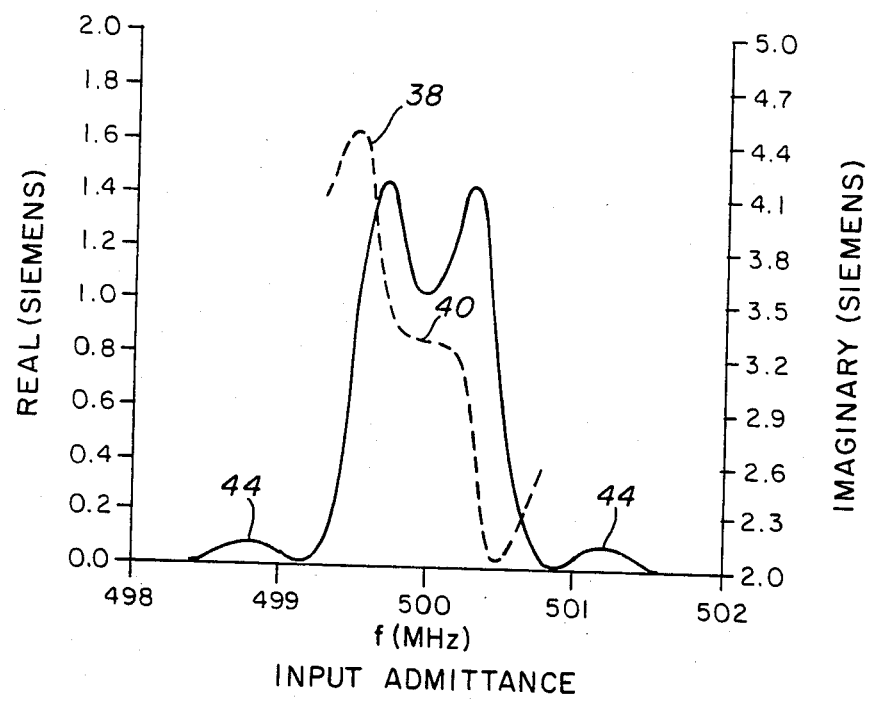
FIG. 11 illustrates the input admittance characteristics in a theoretical single-phase unidirectional transducer having a 45° phase shift between centers of reflection and transduction and having 600 wavelengths of active electrodes.

FIG. 11 shows a theoretically predicted case of one such input admittance characteristic in which a single-phase, unidirectional transducer was assumed with a 45° phase shift between the centers of wave reflection and the centers of transduction (i.e., one-eighth wave length). An unweighted transducer was considered with 600 wave lengths of active electrodes with a coupling coefficient typical of that of a quartz substrate and internal reflection coefficient per wave length of 0.0022. It will be noted that the susceptance curve 38 has the desired flat spot 40.

Figure 12:
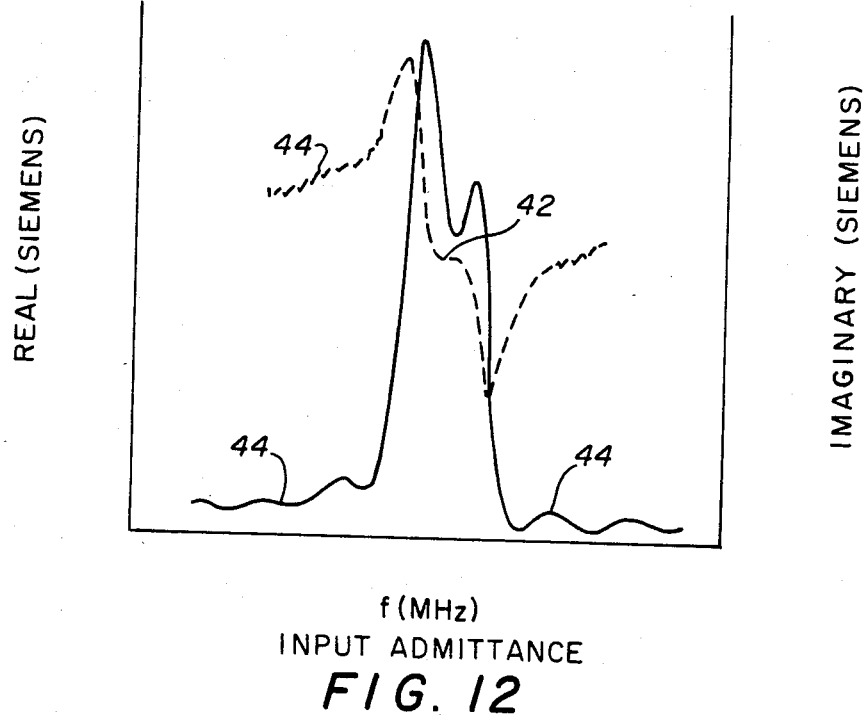
FIG. 12 illustrates the input admittance characteristics in an experimental single-phase unidirectional transducer having 200 wavelengths of active electrodes in which out-of-band ripple is present.

FIG. 12 discloses an experimental result of the input admittance of a single-phase, unidirectional transducer and again the desired flat spot 42 is evident. In this experimental case, a transducer was used with 200 wave lengths of active electrodes and a reflection coefficient of 0.0066.

Figure 13:
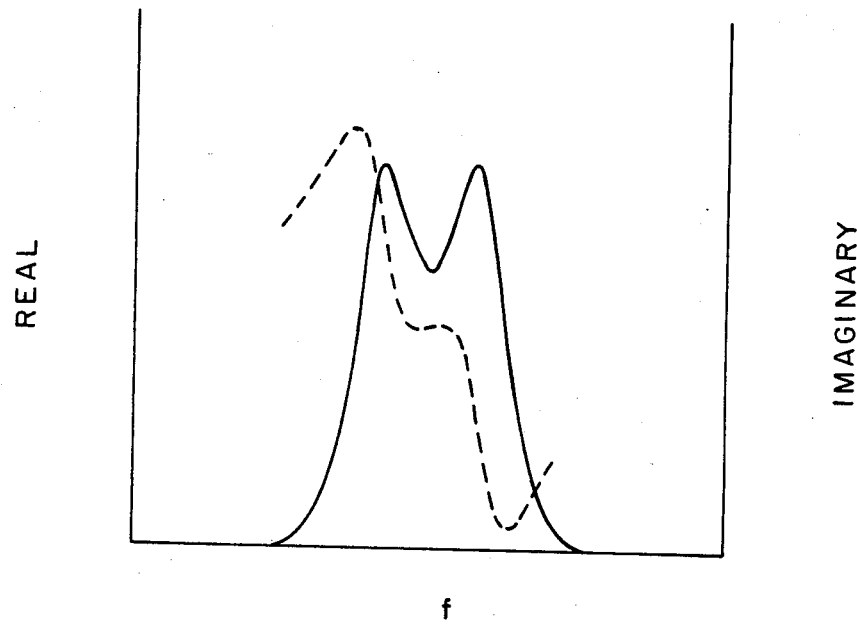
FIG. 13 illustrates how the out-of-band ripple can be removed with a modest amount of electrode overlap weighting of the 600 wavelength transducer used to obtain the graph of FIG. 11.

It will be noted in FIG. 12 that small ripples 44 are seen in the admittance characteristic in the out-of-band region which can result in undesired ripple in the final notch circuit configuration. In FIG. 13 the effect of a rather modest amount of overlap weighting of the 600 wave length long device shown earlier in FIG. 11 is seen. As can be seen, the out-of-band ripples are almost totally suppressed.

FIGS. 14 through 19 show the theoretical input admittance of the same device shown earlier in FIG. 11 but in this case the internal reflection per wave length is set respectively to 0%, 25%, 50%, 100%, 150%, and 200% of the amount required for just achieving a relatively flat susceptance characteristic. It is evident that a moderate range of various internal reflectivities are acceptable for approximately flat input admittance characteristics.

In a single-phase, unidirectional transducer device, the phase angle between the transduction centers and reflection centers can be varied. In U.S. Pat. No. 4,353,046, the location of the centers of reflection are varied with respect to the centers of transduction. In the commonly assigned copending patent application Ser. No. 677,513, filed Dec. 3, 1984 and entitled "Surface Acoustic Wave Transducer", the centers of transduction are varied with respect to the centers of reflection. FIGS. 20-28 show the input admittance of the same 600 wave length transducer used to obtain FIG. 11 where the phase angle between the centers of transduction and reflection is varied from 0° (a normal SAW device type) is 15°, 30°, 40°, 45° (the optimum), 50°, 60°, 75°, and finally 90° (another normal SAW configuration). The centers of reflection for a reflective element, as defined herein, are considered to be the points where the reflection coefficient is purely imaginary. The reflection coefficient can be either positive or negative. The centers of transduction, as defined herein, are considered to be the points in a transducer where the locally transduced components of the forward and backward waves are in phase with each other. As is evident from these figures, useful characteristics are achieved in the range of 30° to 60° (FIG. 22 through FIG. 26) and probably beyond. In each of the FIGS. 22 through 26, a reasonable flat spot 46 is found in the susceptance curve.

Thus, the advantage of implementing the desired input conductance function with a single-phase, unidirectional transducer is that it is derived so simply and in such a compact form.

As stated earlier, SAW devices of themselves are band pass elements. Therefore, to implement a notch filter with SAW devices, one must use the device with some type of external circuit. This external circuit can consist of a wide range of configurations. As stated earlier, normal LC high pass circuits, low-pass circuits, all-pass circuits, or band-pass circuits could be used wherein one of the capacitors in any one of those circuits is replaced with the SAW impedance element. The SAW impedance element is a capacitor except in the vicinity of its resonance at which frequency it then becomes a lossy capacitor. This loss will cause an increase in the loss of the LC filter circuit at that particular frequency or frequency band.

Figure 29:
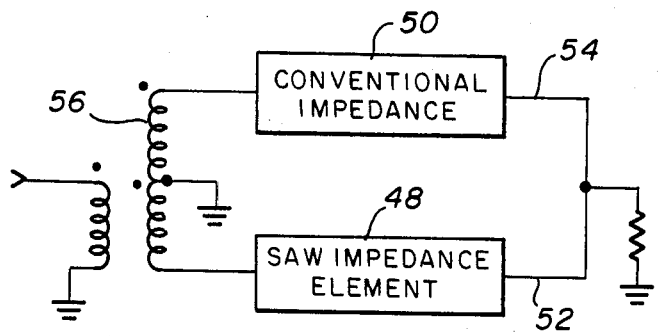
FIG. 29 illustrates a transformer-bridge notch filter in which the impedance element of the present invention is used.

Another class of circuits is the bridge circuit as shown in FIG. 29 which is a transformer bridge. In this case, the SAW impedance element 48 and a conventional impedance 50 in the two legs 52 and 54 are chosen such that equal impedances are achieved at the desired notch frequency. Under that condition a balance occurs and no signal is transmitted to the output load resistor. In general, the SAW impedance element may also include other conventional inductors, capacitors or resistors to help smooth the band pass in the out-of-band regions. The phase reversal transformer 56 is the element which causes the signal through one leg to be out of phase with the signal in the other leg at resonance.

Figures 30A, 30B:
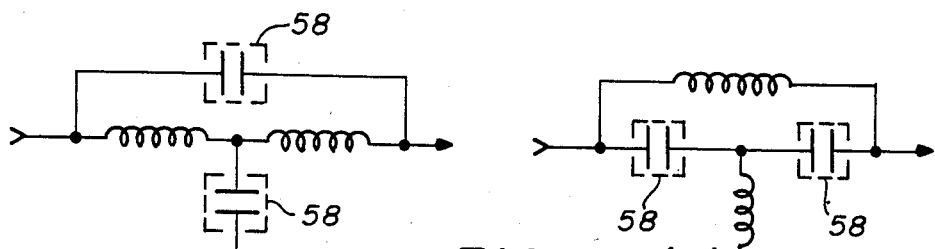
FIGS. 30a and 30b illustrate variations of all-pass filters which can be used for notch filter applications by replacing the capacitors therein with the impedance element of the present invention.

The all-pass circuit configurations in FIGS. 30(a) and (b) can be used for a notch filter by replacing one or both of the capacitors with the SAW impedance element of the present invention. The SAW impedance element is represented by the dashed line 58 in FIGS. 30(a) and (b). At the resonant frequency of the SAW device, the capacitor becomes lossy and the transmission characteristics are significantly degraded thereby making a notch. If the proper impedance is achieved by the SAW, this circuit can theoretically approach a bridged-T notch at the desired frequency.

Figure 31:
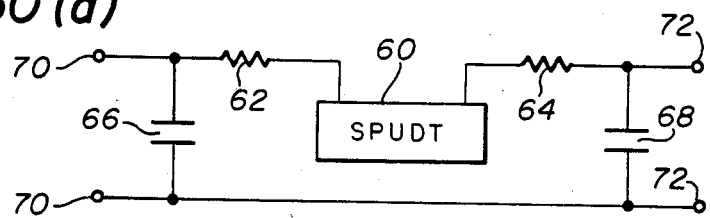
FIG. 31 is the equivalent circuit of a packaged, single-phase, unidirectional transducer element having a single port and forming the impedance element of the present invention.

FIG. 31 is a schematic representation of the equivalent circuit for a packaged, single-phase, unidirectional transducer 60 including parasitic effects. Such a transducer is disclosed in U.S. Pat. No. 4,353,046 and also in the commonly assigned copending patent application, Ser. No. 677,513 field Dec. 3, 1984 and entitled "Surface Acoustic Wave Transducer". The one port transducer 60 is shown as a single box in the diagram. Parasitic resistance elements 62 and 64 are connected on each side representing electrical resistance in the transducer 60 metalization and in the feed-through leads on the hermetic package which typically have a resistance of 0.3 ohms. Also, on each side of the transducer 60 is a small capacitance 66 and 68 which represent the feed-through capacitance to the surface acoustic wave package which is approximately 0.2 pF. The input to the circuit is coupled to terminals 70 while the output is received at terminals 72.

Figure 32:
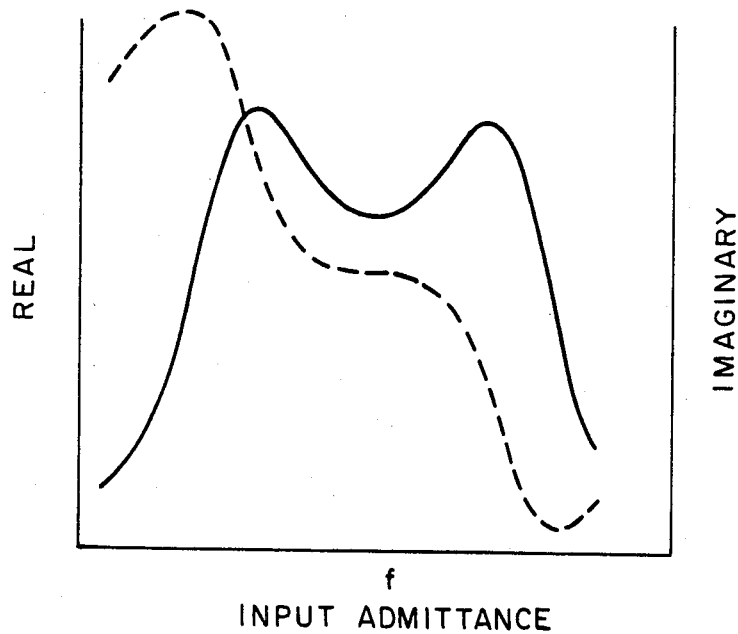
FIG. 32 is a graph illustrating the input admittance, both real and imaginary, for the novel impedance element in the very limited range in the vicinity of the desired operating frequency.

The single-port, single-phase, unidirectional transducer 60 shown in FIG. 31 has an admittance characteristic shown in FIG. 32 or in any one of the earlier discussed admittance characteristics. That admittance is obtained by the particular construction of the transducer as will be discussed hereafter. A wide range of single-phase, unidirectional transducer designs are possible and, by varying the number of active electrodes and the acoustic beam width, various impedance levels can be achieved, some of which may be more "optimum" than others for notch filter use. In designing such notch filter, it should have an acceptable insertion loss, reasonable width and depth of the notch itself, and flat amplitude response characteristics from 50 to 500 MHz.

Figure 33:
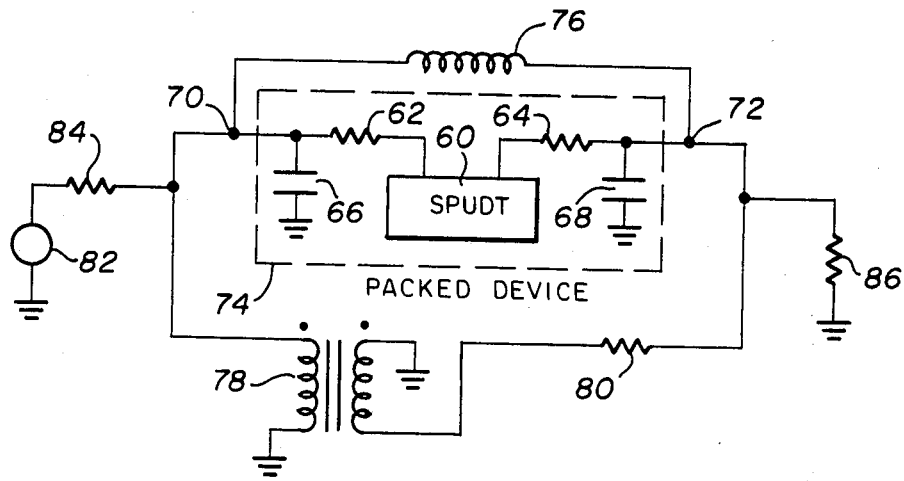
FIG. 33 is a diagrammatic representation of the novel notch filter configuration disclosed herein.

The unique notch filter configuration using the equivalent circuit of the packaged, single-phase, unidirectional transducer impedance element shown in FIG. 31 is diagrammatically represented in FIG. 33. All of the elements shown within dashed line 74 in FIG. 33 are the elements shown in FIG. 31 which is the packaged, single-phase, unidirectional transducer impedance element utilized as a single-port device. The novel notch filter configuration shown in FIG. 33 comprises a first circuit including the packaged, single-phase, unidirrectional transducer impedance element 74 coupled as a single-port device in parallel with an inductor 76. A second circuit is in parallel with the first circuit and comprises a phase-reversing transformer 78 and a series connected resistor 80. A frequency source 82 applies a signal through source resistor 84 to the parallel arrangement of the first and second circuits. The load 86 is coupled to the output of the first and second parallel circuits.

The wide band frequency characteristic of this circuit (to 500 MHz) can be understood by recognizing that except for a small frequency range near resonance, the single-phase, unidirection transducer 60 is only a finite "Q" capacitor. If the single phase, unidirectional transducer device 60 is simply regarded as a capacitor with finite "Q" the circuit will have all pass characteristics.

For optimum performance in that case, if the bridging resistor 80 is chosen to have a resistance value that is twice the resistance value of the input resistance 84 and the load resistance 86 (which are of nominal equal value), the transmission characteristic of the complete circuit is nominally flat at all frequencies.

In the neighborhood of the notch frequency, the inductor 76 resonates with the static capacitance of the single-phase, unidirectional transducer device 60. This resonant condition existing between the inductor 76 and the transducer device 60 causes the first or upper parallel circuit (equivalent to the parallel circuit in FIG. 2) to have primarily resistive characteristics in the neighborhood of the notch frequency. The transmission of frequencies is then a balance of the currents flowing in the upper resonant circuit and the second circuit comprising the phase reversal transformer 78 and resistor 80. If resistor 80 is chosen to be approximately equal to the equivalent resistance of the finite "Q" resonant circuit (first or upper parallel circuit), the phase reversal transformer will cause the signals from the first and second parallel circuits to cancel at the output. Thus, at the notch frequency no signal is transmitted from the input source 82 to the output load 86. At all other frequencies other than the notch frequency, the transmission from the frequency source 82 to output load 86 is the sum of the frequency dependent coupling through the parallel resonant circuit, which has variations in both magnitude and phase and the frequency independent coupling through the reversal transformer 78 and resistor 80.

If the source and load resistance 84 and 86 are chosen to have a value equal to one-half of the bridging resistor 80, the magnitude and phase of the two contributions are such that the magnitude of the transmission is approximately flat at all frequencies other than the notch bandwidth.

Several different designs of the single-phase, unidirectional transducer device 60 were theoretically modeled in an effort to optimize the parameters in such a way that each design would represent an improvement over the preceding one. At the time of this theoretical modeling it had not been discovered that for optimum transmission the bridging resistor (80 in FIG. 33) should have a value twice that of the source and load resistors (84 and 86 in FIG. 33). The results of the tests are shown in TABLE 1 for four cases, A, B, C, and D.

TABLE 1

| CASE | W | L | Ins. Loss 50 MHz (dB) | Inc. Loss 500 MHz (dB) | Ins. Loss 218 MHz (dB) | 30 dB B/W (KHz) | Ind. I (nH) | QI | Rs | SPUDT Cap. (pF) |
|---|---|---|---|---|---|---|---|---|---|---|
| A | 50 | 100 | 1.2 | 2.5 | 22.7 | 400 | 94.1 | 100 | 1424 | 5.6 |
| B | 50 | 200 | 2.1 | 2.6 | 13.3 | 300 | 47.1 | 100 | 405 | 11.1 |
| C | 100 | 200 | 3.6 | 3.9 | 10.4 | 250 | 23.6 | 100 | 194 | 22.2 |
| D | 50 | 400 | 5.9 | 6.1 | 6.5 | 140 | 23.8 | 100 | 103 | 22.0 |

The first design was case A and, as can be seen in TABLE 1, was chosen to have a single-phase, unidirectional transducer 60 with 100 wave lengths of active electrodes and 50 wave lengths acoustic beamwidth. The reflection parameters were adjusted until a desired "flat spot" 88 was achieved in the input admittance characteristics such as that shown in FIG. 32. The graph shown in FIG. 32 is for case D but illustrates the "flat spot" 88 which can generally be achieved in the input admittance characteristic.

Next, the various parasitic resistances and capacitances were added to the model. An inductance 76 was chosen of the appropriate value to exactly resonate with the static capacitance of the single-phase, unidirectional transducer 60 at the center frequency of the transducer. The value of resistor 80 (Rs) was then chosen which was appropriate to equal the equivalent resistance of the inductor-transducer parallel circuit to provide a null or notch at the desired center frequency when the entire structure was coupled as shown in FIG. 33. As can be seen in Table 1, the insertion loss at 218 MHz for case A was 22.7 dB although a very wide bandwidth of 400 KHz occurred at the 30 dB points. The inductance of inductor 26 was 94.1 nH and the "Q" was 100. The resistor 30 was required to have a resistance of 1,424 ohms and the capacitance of the transducer was 5.6 pF.

In case B, the wave length of the transducer was maintained at 50 while the number of electrodes was increased to 200 wave lengths. With the value of Rs, or resistance 80, dropped to 405 ohms, the transducer capacitance increased to 11.1 pF. At the same time, the bandwidth decreased to 300 HKz at the 30 dB points but the insertion loss dropped at 218 MHz to 13.3 dB.

For case C, the acoustic beam width was increased to 100 wave lengths while the number of electrodes was maintained at 200 wave lengths. The value of resistor 80 dropped to 194 ohms and the transducer capacitance increased to 22.2 pF. At this point, the bandwidth at the 30 dB points decreased to 250 KHz but the insertion loss at 218 MHz had dropped to 10.4 dB.

For case D, the acoustic beam width was reduced again to 50 wave lengths while the number of electrodes was increased 400 wave lengths. With these parameters the value of resistor 80 dropped to 103 ohms and the transducer capacitance was 22 pF. The bandwidth at the 30 dB points was reduced to 140 KHz but the insertion loss was almost flat for all frequencies in the range from 50 MHz to 500 MHz. Also, the bandwidth of 140 KHz is extremely large compared to the prior art devices.

As can be seen in cases C and D, when the bridging resistor value began to approximate twice the value of the source and load resistors (75 ohms) the transmission characteristics began to be approximately flat at all frequencies except the notch bandwidth.

Figure 34:
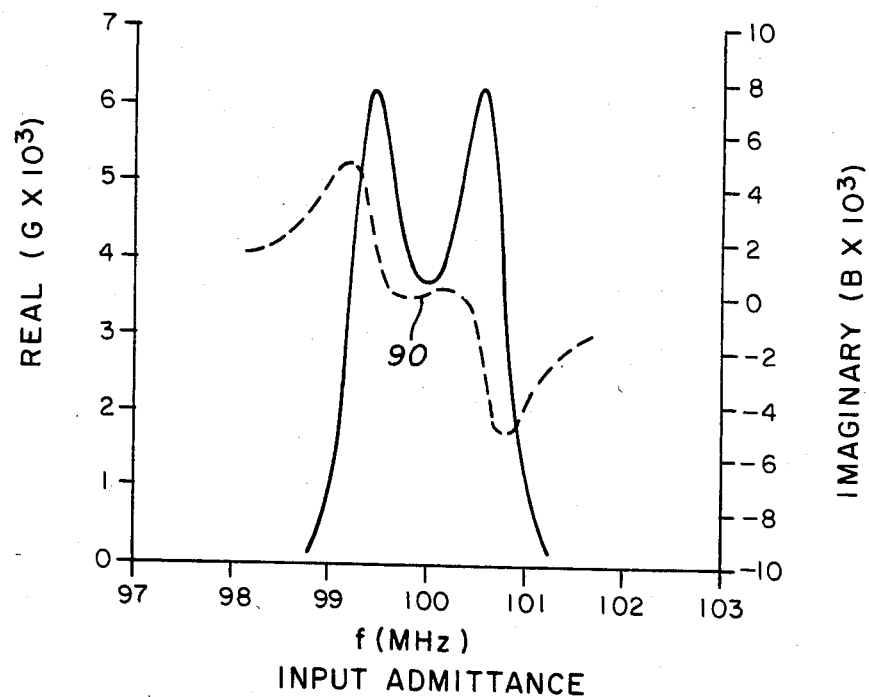
FIG. 34 is a graph representing the input admittance for an experimental single-phase, unidirectional transducer plotted as both real and imaginary.

FIG. 34 is a graph illustrating, in general, the input admittance, both real and imaginary, for a single-phase, unidirectional transducer in the frequency range from approximately 99 to 101 MHz. It will be noted that at the center frequency of approximately 100 MHz the admittance, both real and imaginary, has a substantial "flat spot" 90.

Figure 35:
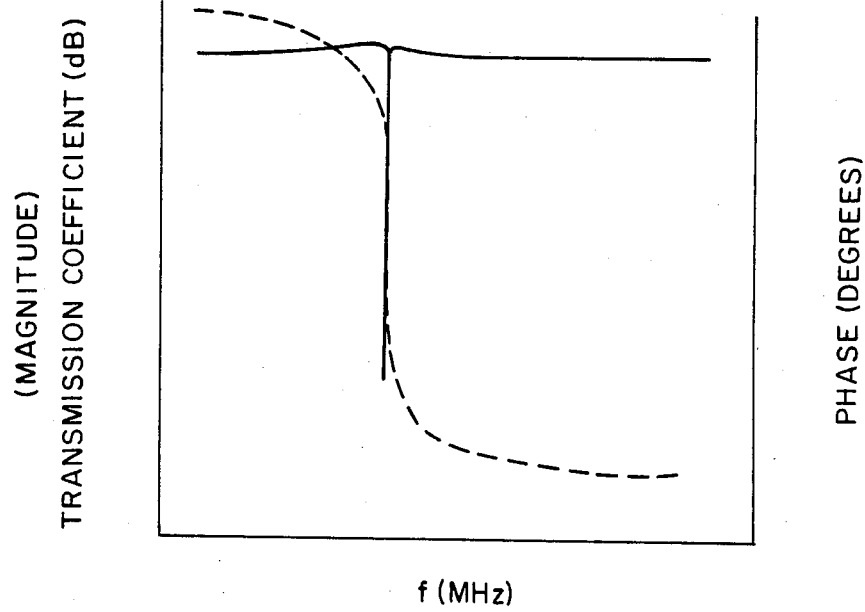
FIG. 35 illustrates the theoretical frequency response of the novel notch filter over a very broad frequency range in both magnitude and phase.

FIG. 35 is a graph showing the frequency response of the novel notch filter with the parameters set forth in TABLE 1 as case D over a very broad frequency band from 50 MHz to 500 MHz. It will be noted that the overall transmission characteristic is reasonably flat all the way from 50 to 500 MHz yet the insertion loss is held to approximately 6½ dB.

Figure 36:
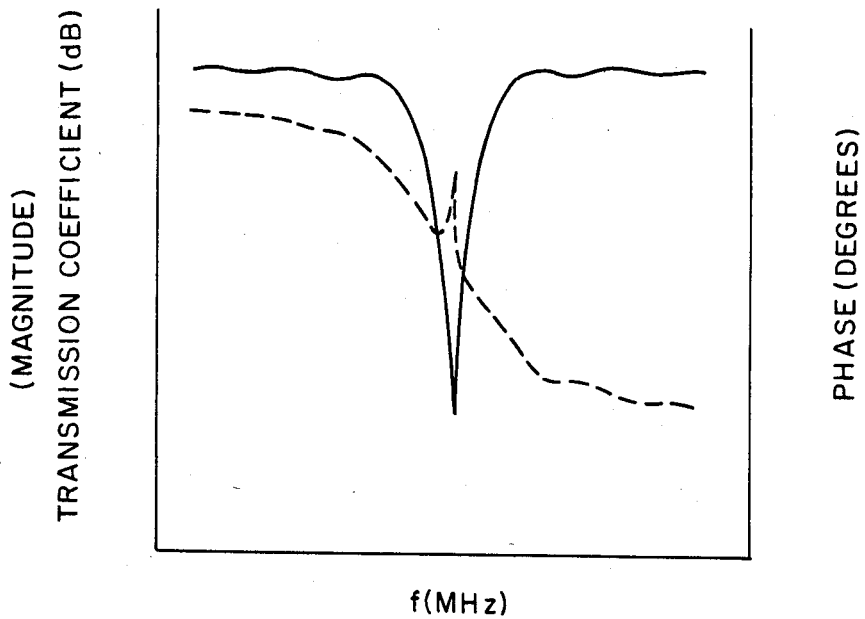
FIG. 36 is a graph illustrating the bandwidth of the notch of the present invention lotted over a very restricted frequency range.

FIG. 36 graphically illustrates the bandwidth of the notch for case D in TABLE 1 plotted over a very restricted frequency range from 218 MHz up to 222 MHz. The phase response of the complete notch circuit is also shown. As can be seen in FIG. 36, at the 30 dB points, a reasonably wide notch is obtained when compared to prior art devices.

Figure 37:
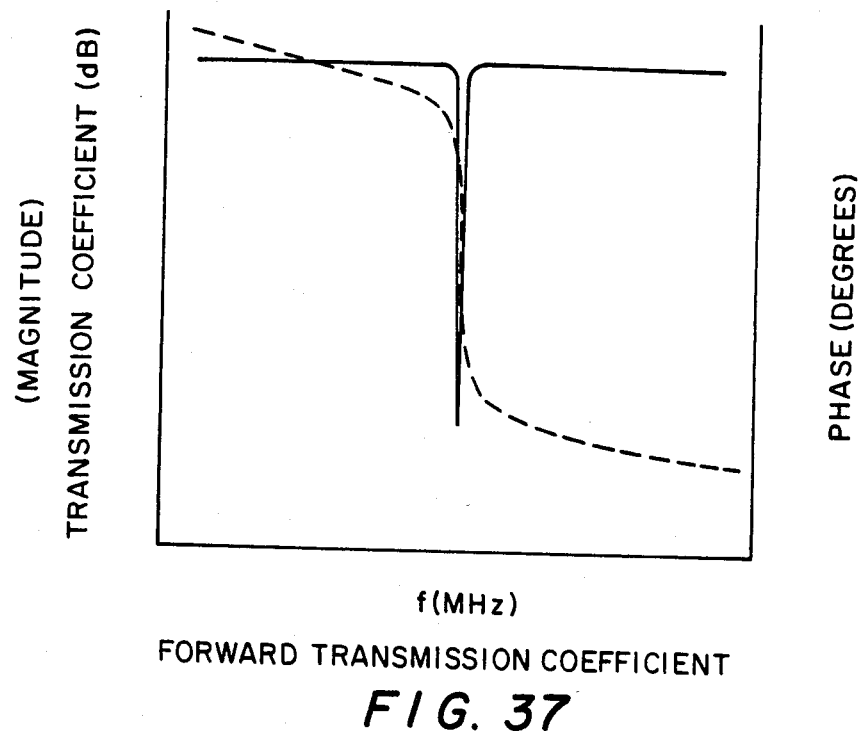
FIG. 37 is a graph showing the experimental frequency response of the novel notch filter over an intermediate band width range illustrating both the magnitude and phase of the transmission.

FIG. 37 graphically illustrates the frequency response of the complete notch filter for case D shown in TABLE 1 over an intermediate bandwidth range of 200 MHz to 240 MHz. Again, the transmission characteristic is quite flat. The phase characteristic of the overall notch circuit is shown.

FIG. 32 is a graphical representation of the input admittance of the SAW impedance element of case D in TABLE 1 in the vicinity of the desired operating frequency, 220 MHz. At frequencies far removed from this operating frequency, the single-phase, unidirectional transducer 10 can be regarded simply as a capacitor with the capacitance given by the value shown in TABLE 1. Again it will be noted in FIG. 32 that the input admittance curves, real and imaginary parts, are both reasonably constant over a wide bandwidth and the desired "flat spot" 88 is achieved in the input admittance characteristic over a substantial frequency range.

It will be noted in FIG. 32 that the susceptance curve has an exact flat spot only at the center of the notch bandwidth. This spot occurs where the bridging resistor exactly equals the parallel circuit resistance at resonance. As the bridging resistor is made slightly larger than the parallel circuit resistance at resonance, and if the susceptance curve begins to tip slightly upwards prior to resonance as shown in FIG. 34, resonance can occur at two or three points thereby resulting in a wider notch bandwidth.

Figure 38:
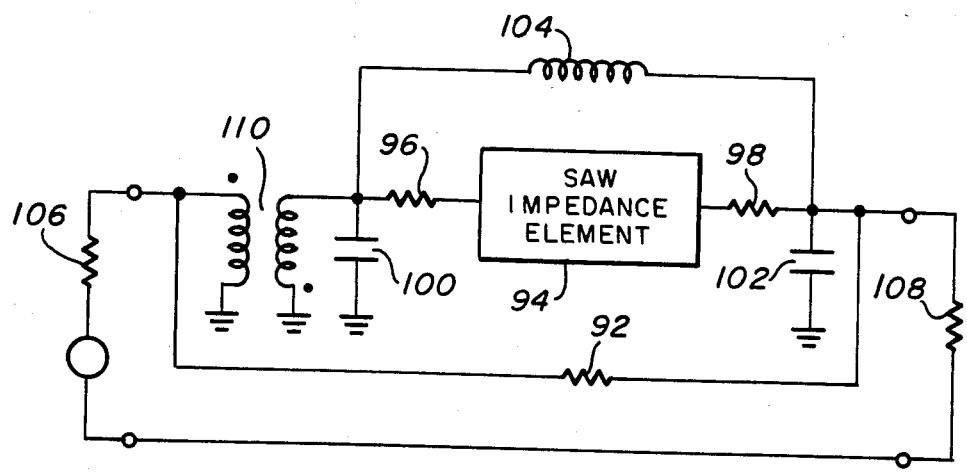
FIG. 38 illustrates a model of an alternative transformer-bridge notch circuit using the surface acoustic wave impedance element of the present invention.

FIG. 38 shows a model of an alternative transformer-bridge notch circuit using the SAW impedance element of this invention. This is a circuit of the class shown in FIG. 29. In this case the conventional impedance element side of the bridge consists simply of a resistor 92. The other side of the bridge consists of the SAW impedance element 94, resistors 96 and 98 and capacitors 100 and 102 to model the parasitic elements that are of necessity a part of a physically realizable SAW impedance element. A bridging inductor 104 resonates the SAW impedance element 94 such that a pure resistive load is presented for balancing the bridge to match the balancing arm 92. It can be shown that the optimum source impedance 106 and load impedance 108 to use with this particular circuit are each equal to RB/2 where RB is resistor 92. Phase reversal transformer 110 shown in the SAW impedance element 94 arm could have been placed in the conventional impedance 92 arm. It serves to reverse the signal phase in one arm so that at resonance the signals in the two arms cancel.

Figure 39:
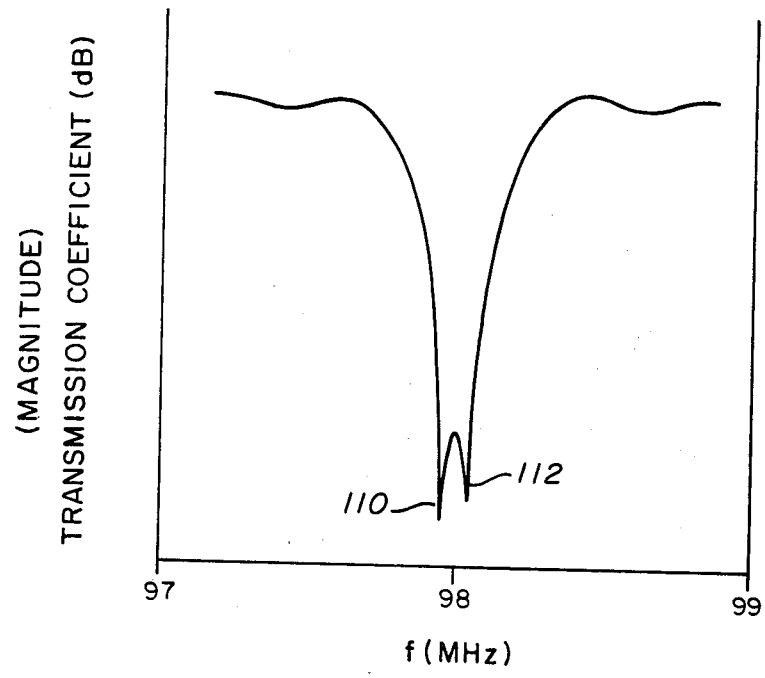
FIG. 39 illustrates the theoretical transmission characteristics of the circuit of FIG. 38 over a limited frequency range.
Figure 40:
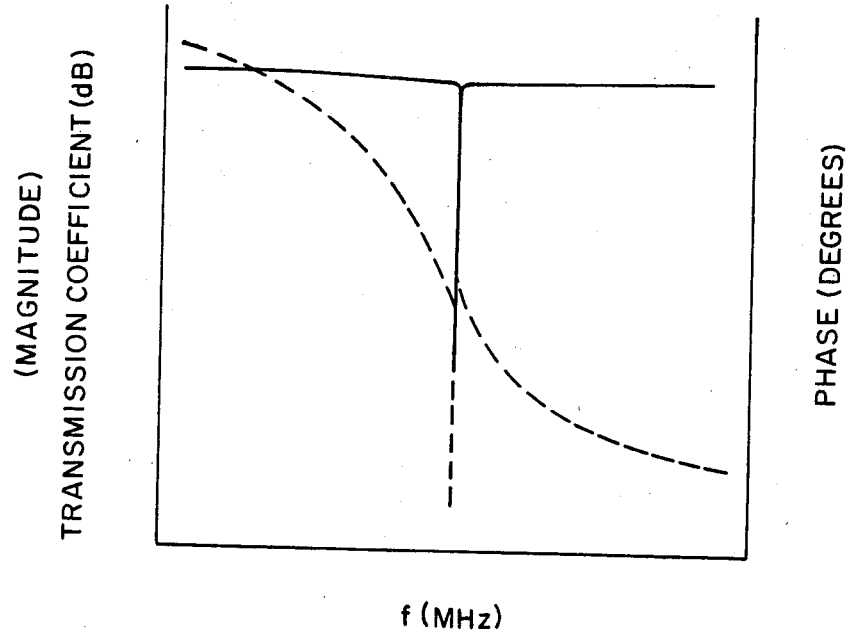
FIG. 40 illustrates the transmission characteristic of the circuit of FIG. 38 over a wide frequency range.

FIGS. 39 and 40 illustrate the performance of the notch in FIG. 38 in which the novel impedance element 94 of this invention has been utilized. Notice that the bottom of the notch now consists of two rejection peaks 110 and 112 and the bottom of the notch is thereby widened. The widening of the notch is a significant improvement over the previous notches shown earlier in FIGS. 5 through 8, in that a broader rejection band is achieved without significantly degrading the width at the 3 dB points on the notch. The sharp rejection characteristics shown earlier in those figures are also similar to the sharp rejection which has been achieved with previous SAW notches.

Thus, there has been disclosed a novel and improved impedance element especially useful for a notch filter for rejecting a predetermined band of signal frequencies. The novel impedance element generates a conductance versus frequency response having first and second peaks separated by a valley at a particular frequency and a susceptance versus frequency response having a substantially flat portion over a finite bandwidth on either side of said particular frequency.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. An impedance element comprising:
   a. a piezoelectric substrate, and
   b. a single port, surface acoustic wave transducer mounted on said substrate and adjusted to generate conductance and susceptance response characteristics of a shape as shown in FIG. 9.

2. An impedance element comprising:
   a. a piezoelectric substrate, and
   b. a single port, surface acoustic wave transducer mounted on said substrate and adjusted to generate conductance and susceptance response characteristics of a shape in the range from the response shown in FIG. 22 to the response shown in FIG. 26.

3. An impedance element as in claim 1 or 2 wherein said surface acoustic wave transducer is a single-phase unidirectional transducer.

4. A method of forming an impedance element comprising the steps of:
   a. selecting a desired conductance versus frequency response function having first and second peaks separated by a valley, said valley occurring at a desired frequency,
   b. calculating the square root of said function,
   c. taking the inverse Fourier transform of said square root to obtain an impulse response,
   d. forming a surface acoustic wave device having substantially no internal reflections, and
   e. weighting electrodes on said device to generate a susceptance versus frequency response having a substantially flat portion over a finite bandwidth on both sides of said desired frequency.

5. An improved impedance element comprising:
   a. a first single-port, surface acoustic wave transducer having a first single-peak conductance versus frequency characteristic, and
   b. a second single-port, surface acoustic wave transducer coupled in parallel with said first transducer and having a second single-peak conductance versus frequency response characteristic spaced a predetermined bandwidth from said first single peak thereby creating a combined conductance versus frequency response characteristic having two peaks separated by a valley at a predetermined frequency and a combined susceptance versus frequency response characteristic having a substantially flat portion over a finite bandwidth on both sides of said predetermined frequency.

6. An improved impedance element comprising:
   a. a single port, surface acoustic wave device including input and output conductors mounted on a piezoelectric substrate, and
   b. means for adjusting the weighting functions for the electrical transduction and for the acoustic reflections of said surface acoustic wave device to cause the admittance of said device to have a conductance versus frequency response characteristic having first and second peaks separated by a valley at a predetermined frequency and a susceptance versus frequency response characteristic having a substantially constant portion over a finite bandwidth on both sides of said predetermined frequency.

7. An impedance element as in claim 6 wherein said surface acoustic wave transducer for generating said conductance and susceptance response characteristics comprises:
   a. a substrate having centers of transduction and reflection, and
   b. means for spacing said centers of transduction and reflection so as to create a single-phase, unidirectional transducer having said desired conductance and susceptance responses.

8. An impedance element as in claim 7 further including:
   a. said substrate having at least a piezoelectric layer, and
   b. interdigitated electrodes mounted on said substrate so as to cause wave propagation in said piezoelectric layer in a predetermined orientation to cause unidirectional transmission of acoustic waves from said transducer.

9. An impedance element as in claim 8 further including:
   a. inductor means placed in parallel with said impedance element to form a first parallel resonant circuit which is substantially resistive at resonance and substantially reactive at all other frequencies, said first parallel resonant circuit having a substantially flat transmission characteristic at all frequencies,
   b. resistor means coupled in parallel with said first parallel circuit to form a second parallel circuit having first and second legs, said resistor passing all frequencies applied thereto, and
   c. means coupled to either leg of said parallel circuit to reverse signal polarity through said coupled leg whereby at resonance of said first parallel circuit said signals through said legs are equal and opposite and thereby cancelled to form a notch filter.

10. An impedance element as in claim 9 wherein said signal polarity reversing means in either leg of said second parallel circuit is a phase reversal transformer.

11. An improved impedance element as in claim 6 wherein said means for adjusting the weighting functions of said device comprises conductors that have been withdrawal weighted to provide the desired admittance.

12. An improved impedance element as in claim 6 wherein said means for adjusting the weighting functions of said device comprises conductors that have been overlap weighted to provide the desired admittance.

13. An improved impedance element as in claim 6 wherein said means for adjusting the weighting functions of said device comprises additional reflective material deposited on predetermined ones of said electrodes.

14. An improved impedance element as in claim 6 wherein said means for adjusting the weighting functions of said device comprises grooves formed in said substrate between predetermined ones of said conductors.

15. An improved impedance element as in claim 6 wherein said means for adjusting the weighting functions of said device comprises conductors that have been capacitive weighted to provide the desired admittance.

16. A method of forming an improved impedance element comprising the steps of:
   a. forming a single port, surface acoustic wave transducer having input and output electrodes, and
   b. adjusting the weighting functions for the electrical transduction and for the acoustic reflections of said device to cause the admittance of said device to have a conductance versus frequency response characteristic having first and second peaks separated by a valley at a predetermined frequency and a susceptance versus frequency response characteristic having a substantially constant portion over a finite bandwidth on both sides of said predetermined frequency.

17. A method as in claim 16 further including the steps of:
   a. forming at least a piezoelectric layer on a substrate, and
   b. mounting said electrodes in interdigitated relationship on said substrate so as to cause wave propagation in said piezoelectric layer in a predetermined orientation to cause unidirectional transmission of acoustic waves from said transducer.

18. A method as in claim 16 wherein the step of adjusting the weighting functions of said device comprises the step of withdrawal weighting said electrodes to provide the desired admittance.

19. A method as in claim 16 wherein the step of adjusting the weighting functions of said device comprises the step of overlap weighting said electrodes to provide the desired admittance.

20. A method as in claim 16 wherein the step of adjusting the weighting functions of said device comprises the step of depositing additional reflective material on predetermined ones of said electrodes to obtain the desired admittance.

21. A method as in claim 16 wherein the step of adjusting the weighting function of said device comprises the steps of:
   a. mounting said electrodes on a piezoelectric substrate, and
   b. forming grooves in said substrate between predetermined ones of said electrodes to weight said reflections to provide the desired admittance.

22. A method as in claim 16 wherein the step of adjusting the weighting functions of said device comprises the step of capacitive weighting said electrodes to obtain the desired admittance.

* * * * *